US009007863B1

(12) United States Patent
Song et al.

(10) Patent No.: US 9,007,863 B1
(45) Date of Patent: Apr. 14, 2015

(54) SEMICONDUCTOR DEVICES

(71) Applicant: SK Hynix Inc., Icheon-si Gyeonggi-do (KR)

(72) Inventors: Choung Ki Song, Yongin-si (KR); Yo Sep Lee, Gimpo-si (KR); Chan Gi Gil, Seoul (KR); Chang Hyun Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/176,599

(22) Filed: Feb. 10, 2014

(30) Foreign Application Priority Data

Oct. 14, 2013 (KR) .................... 10-2013-0121773

(51) Int. Cl.
*G11C 7/00* (2006.01)
*G11C 11/406* (2006.01)
(52) U.S. Cl.
CPC .... *G11C 11/40615* (2013.01); *G11C 11/40626* (2013.01); *G11C 11/406* (2013.01)
(58) Field of Classification Search
CPC .............. G11C 11/406; G11C 11/40626
USPC ................................ 365/222, 212
See application file for complete search history.

(56) References Cited

U.S. PATENT DOCUMENTS

| 7,443,754 | B2 * | 10/2008 | Sako | 365/212 |
| 8,787,104 | B2 * | 7/2014 | Kim | 365/222 |
| 2010/0232246 | A1 * | 9/2010 | Chung | 365/222 |
| 2014/0003161 | A1 * | 1/2014 | Son et al. | 365/189.02 |

FOREIGN PATENT DOCUMENTS

| KR | 1020090016522 A | 2/2009 |
| KR | 1020090085316 A | 8/2009 |

* cited by examiner

*Primary Examiner* — Son Mai
(74) *Attorney, Agent, or Firm* — William Park & Associates Patent Ltd.

(57) ABSTRACT

A semiconductor device including a control signal generator and an internal refresh signal generator is provided. The control signal generator generates first and second control signals, one of which is selectively enabled in response to temperature code signals and mode set signals after a pulse of an internal refresh signal is outputted by the internal refresh signal generator. The temperature code signals are obtained from temperature signals. The internal refresh signal generator outputs a refresh command signal as the internal refresh signal when the first control signal is enabled. Further, the internal refresh signal generator outputs the refresh command signal as the internal refresh signal at a moment that the refresh command signal is inputted thereto by a predetermined number of times when the second control signal is enabled.

20 Claims, 7 Drawing Sheets

SEMICONDUCTOR DEVICES

CROSS-REFERENCE TO RELATED APPLICATION

The present application claims priority under 35 U.S.C 119(a) to Korean Application No. 10-2013-0121773, filed on Oct. 14, 2013, in the Korean Intellectual Property Office, which is incorporated herein by reference in its entirety as set forth in full.

BACKGROUND

1. Technical Field

Embodiments of the present disclosure generally relate to semiconductor devices, and more particularly to semiconductor devices including a control signal generator and an internal refresh signal generator.

2. Related Art

In the electronics industry, highly integrated fast volatile memory devices such as high performance dynamic random access memory (DRAM) devices widely used as memory devices are increasingly in demand with the development of higher performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of efforts have been focused on reduction of an operating current and a standby current of the semiconductor devices.

A data retention characteristic of a DRAM cell including a single transistor and a single storage capacitor may be very sensitive to a temperature. Thus, it may be necessary to control operation conditions of internal circuit blocks in a semiconductor integrated circuit according to variation of circumferential temperature. For example, DRAM devices employed in mobile systems may be designed to control a refresh cycle time according to variation of circumferential temperature. Temperature sensors such as digital temperature sensor regulators (DTSRs) or analog temperature sensor regulators (ATSRs) have been widely used to control the operation conditions of semiconductor devices such as DRAM devices according to variation of circumferential temperature. These temperature sensors may detect a relatively high temperature and may control an operation cycle time to reduce power consumption in a self-refresh mode. Further, the temperature sensors may monitor a circumferential temperature in a normal operation mode.

Meanwhile, the joint electron device engineering council (JEDEC) regulates a normal mode and an extended mode that control an operation cycle time (i.e., a refresh cycle time) of the semiconductor devices using a mode register set (MRS) in a refresh mode. The refresh cycle time of the semiconductor devices may be set to be reduced in the normal mode and may be set to be increased in the extended mode.

SUMMARY

Various embodiments are directed to semiconductor devices.

According to some embodiments, a semiconductor device includes a control signal generator and an internal refresh signal generator. The control signal generator generates first and second control signals, one of which is selectively enabled in response to temperature code signals and mode set signals after a pulse of an internal refresh signal is outputted by the internal refresh signal generator. The temperature code signals are obtained from temperature signals. The internal refresh signal generator outputs a refresh command signal as the internal refresh signal when the first control signal is enabled. Further, the internal refresh signal generator outputs the refresh command signal as the internal refresh signal at a moment that the refresh command signal is inputted thereto by a predetermined number of times when the second control signal is enabled.

According to further embodiments, a semiconductor device includes a temperature code generator, a control signal generator and an internal refresh signal generator. The temperature code generator decodes temperature signals to generate temperature code signals after a pulse of an internal refresh signal is inputted thereto. The control signal generator generates first to third control signals, one of which is selectively enabled in response to the temperature code signals and mode set signals. The internal refresh signal generator outputs a refresh command signal as the internal refresh signal when the first control signal is enabled. Moreover, the internal refresh signal generator outputs the refresh command signal as the internal refresh signal at a moment that the refresh command signal is inputted thereto by a first predetermined number of times when the second control signal is enabled. Furthermore, the internal refresh signal generator outputs the refresh command signal as the internal refresh signal at a moment that the refresh command signal is inputted thereto by a second predetermined number of times when the third control signal is enabled.

According to further embodiments, a system includes a processor; a memory controller configured to receive a mode set signal from the processor; and a memory device configured to receive the mode set signal from the memory controller, wherein the memory device includes a temperature code generator suitable for decoding temperature signals to generate temperature code signals after a pulse of an internal refresh signal is inputted thereto; a control signal generator suitable for generating first and second control signals, one of which is selectively enabled in response to the temperature code signals and mode set signals received externally from the control signal generator, the temperature code signals being received from the temperature code generator; and an internal refresh signal generator suitable for outputting a refresh command signal as the internal refresh signal to the temperature code generator when the first control signal is enabled and suitable for outputting the refresh command signal as the internal refresh signal to the temperature code generator at a moment that the refresh command signal is inputted thereto by a predetermined number of times when the second control signal is enabled.

BRIEF DESCRIPTION OF THE DRAWINGS

Embodiments of the present invention will become more apparent in view of the attached drawings and accompanying detailed descriptions, in which.

DETAILED DESCRIPTION OF THE EMBODIMENTS

Various embodiments of the present invention will be described hereinafter with reference to the accompanying drawings. However, the embodiments described herein are for illustrative purposes only and are not intended to limit the scope of the present invention.

Figure 1:
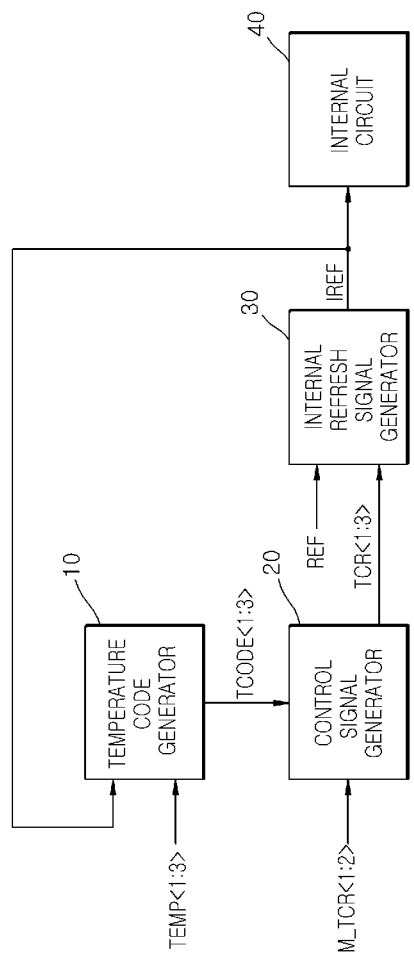
FIG. 1 is a block diagram illustrating a semiconductor device according to an embodiment of the present invention.

Referring to FIG. 1, a semiconductor device according to an embodiment may include a temperature code generator 10, a control signal generator 20, an internal refresh signal generator 30 and an internal circuit 40.

The temperature code generator 10 may decode first to third temperature signals TEMP<1:3> to generate first to third temperature code signals TCODE<1:3> after a pulse of an internal refresh signal IREF is inputted thereto. The first to third temperature signals TEMP<1:3> may include temperature information of the internal circuit 40.

The control signal generator 20 may decode first and second mode set signals M_TCR<1:2> and the first to third temperature code signals TCODE<1:3> to generate first to third control signals TCR<1:3>, one of which is selectively enabled.

The internal refresh signal generator 30 may output a refresh command signal REF as the internal refresh signal IREF when the first control signal TCR<1> is enabled. The internal refresh signal generator 30 may output the refresh command signal REF as the internal refresh signal IREF at a moment that the refresh command signal REF is inputted thereto by a first predetermined number of times when the second control signal TCR<2> is enabled. The internal refresh signal generator 30 may output the refresh command signal REF as the internal refresh signal IREF at a moment that the refresh command signal REF is inputted thereto by a second predetermined number of times when the third control signal TCR<3> is enabled. In some embodiments, the first predetermined number of times may be twice and second predetermined number of times may be four times. The first predetermined number of times and the second predetermined number of times may be set to be different according to the embodiments.

The internal circuit 40 may include a plurality of memory cells and may sense and amplify data signals outputted from the memory cells to execute a refresh operation when the internal refresh signal IREF is inputted thereto.

A configuration of the temperature code generator 10 will be described more fully hereinafter with reference to FIG. 2.

Figure 2:
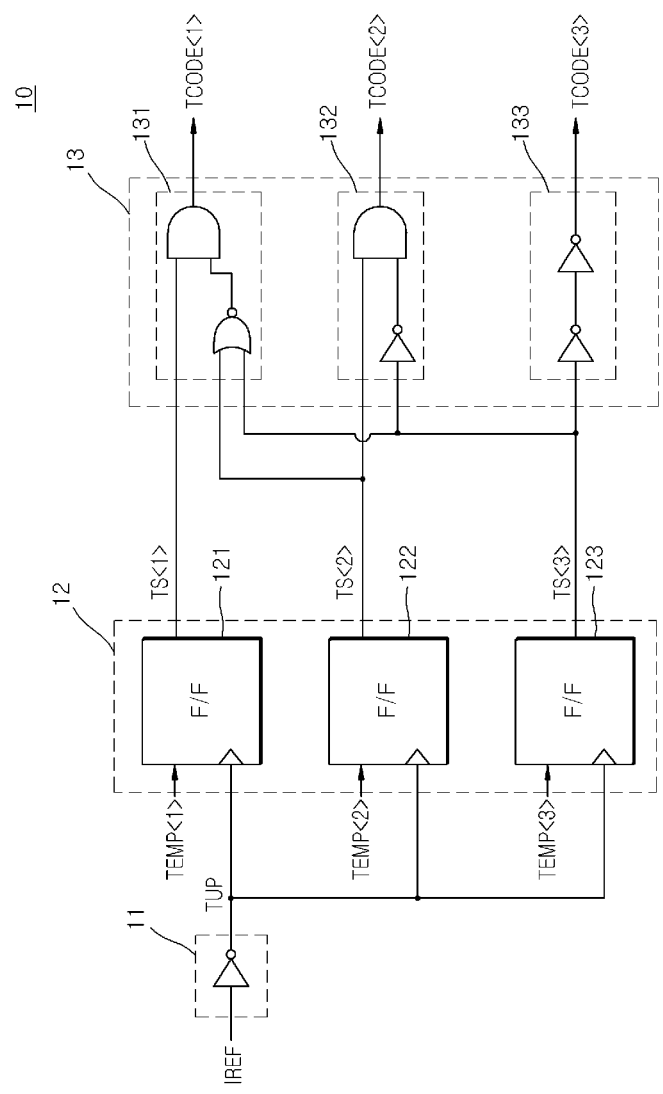
FIG. 2 is a logic circuit diagram illustrating a temperature code generator included in the semiconductor device of FIG. 1.

Referring to FIG. 2, the temperature code generator 10 may include a buffer 11, a transmission signal generator 12 and a temperature code output unit 13.

The buffer 11 may inversely buffer the internal refresh signal IREF to generate an update signal TUP.

The transmission signal generator 12 may include a first flip-flop 121 that outputs the first temperature signal TEMP<1> as a first transmission signal TS<1> when a level of the update signal TUP is changed from a logic "low" level into a logic "high" level, a second flip-flop 122 that outputs the second temperature signal TEMP<2> as a second transmission signal TS<2> when a level of the update signal TUP is changed from a logic "low" level into a logic "high" level, and a third flip-flop 123 that outputs the third temperature signal TEMP<3> as a third transmission signal TS<3> when a level of the update signal TUP is changed from a logic "low" level into a logic "high" level. The first to third flip-flops 121, 122 and 123 may output input signals thereof as output signals thereof when levels of the first to third temperature signals TEMP<1:3> are changed.

In some embodiments, logic levels of the first to third temperature signals TEMP<1:3> according to a temperature of the internal circuit 40 may be set as listed in the following table 1.

TABLE 1

| Temperature of Internal Circuit | TEMP<1> | TEMP<2> | TEMP<3> |
|---|---|---|---|
| First Temperature | L | L | H |
| Second Temperature | L | H | L |
| Third Temperature | H | L | L |

In the table 1, the first temperature may be higher than the second temperature, and the second temperature may be higher than the third temperature. In the present application, the first temperature may be referred to as a high temperature and the second and third temperatures may be referred to as low temperatures.

The temperature code output unit 13 may include a first temperature code output unit 131, a second temperature code output unit 132 and a third temperature code output unit 133. The first temperature code output unit 131 may generate the first temperature code signal TCODE<1> that selectively have a logic "high" level when the first transmission signal TS<1> has a logic "high" level and the second and third transmission signals TS<2:3> have a logic "low" level. The second temperature code output unit 132 may generate the second temperature code signal TCODE<2> that selectively have a logic "high" level when the first and third transmission signals TS<1> and TS<3> have a logic "low" level and the second transmission signal TS<2> has a logic "high" level. The third temperature code output unit 133 may generate the third temperature code signal TCODE<3> that selectively have a logic "high" level when the first and second transmission signals TS<1:2> have a logic "low" level and the third transmission signal TS<3> has a logic "high" level.

A configuration of the control signal generator 20 will be described more fully hereinafter with reference to FIG. 3.

Figure 3:
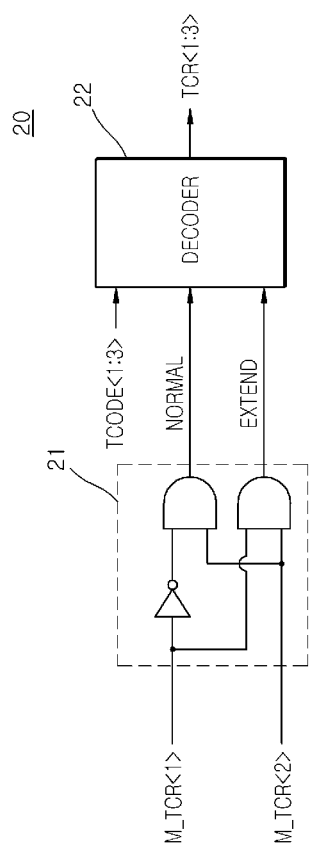
FIG. 3 is a block diagram illustrating a control signal generator included in the semiconductor device of FIG. 1.

Referring to FIG. 3, the control signal generator 20 may include an operation mode signal generator 21 and a decoder 22.

The operation mode signal generator 21 may generate first and second operation mode signals NORMAL and EXTEND, one of which is selectively enabled according to a logic combination of the first and second mode set signals M_TCR<1:2>. The first and second mode set signals M_TCR<1:2> may be signals for setting a normal mode and an extended mode that control a refresh cycle time in a mode register set (MRS).

The first operation mode signal NORMAL may be a signal that puts the semiconductor device into the normal mode, and the second operation mode signal EXTEND may be a signal that puts the semiconductor device into the extended mode.

Logic levels of the first and second operation mode signals NORMAL and EXTEND according to the first and second mode set signals M_TCR<1:2> may be summarized as listed in the following table 2.

TABLE 2

|  | M_TCR<1> | M_TCR<2> | NORMAL | EXTEND |
|---|---|---|---|---|
| Normal Mode | L | H | H | L |
| Extended Mode | H | H | L | H |

The decoder 22 may decode the first to third temperature code signals TCODE<1:3> according to the first and second operation mode signals NORMAL and EXTEND to generate the first to third control signals TCR<1:3>.

When the first operation mode signal NORMAL is enabled to put the semiconductor device into the normal mode, logic levels of the first to third control signals TCR<1:3> according to a temperature of the internal circuit 40 may be summarized as listed in the following table 3.

TABLE 3

|  | TCR<1> | TCR<2> | TCR<3> |
|---|---|---|---|
| High Temperature | H | L | L |
| Low Temperature | L | H | L |

Further, when the second operation mode signal EXTEND is enabled to put the semiconductor device into the extended mode, logic levels of the first to third control signals TCR<1:3> according to a temperature of the internal circuit 40 may be summarized as listed in the following table 4.

TABLE 4

|  | TCR<1> | TCR<2> | TCR<3> |
|---|---|---|---|
| High Temperature | L | H | L |
| Low Temperature | L | L | H |

A configuration of the internal refresh signal generator 30 will be described more fully hereinafter with reference to FIG. 4.

Figure 4:
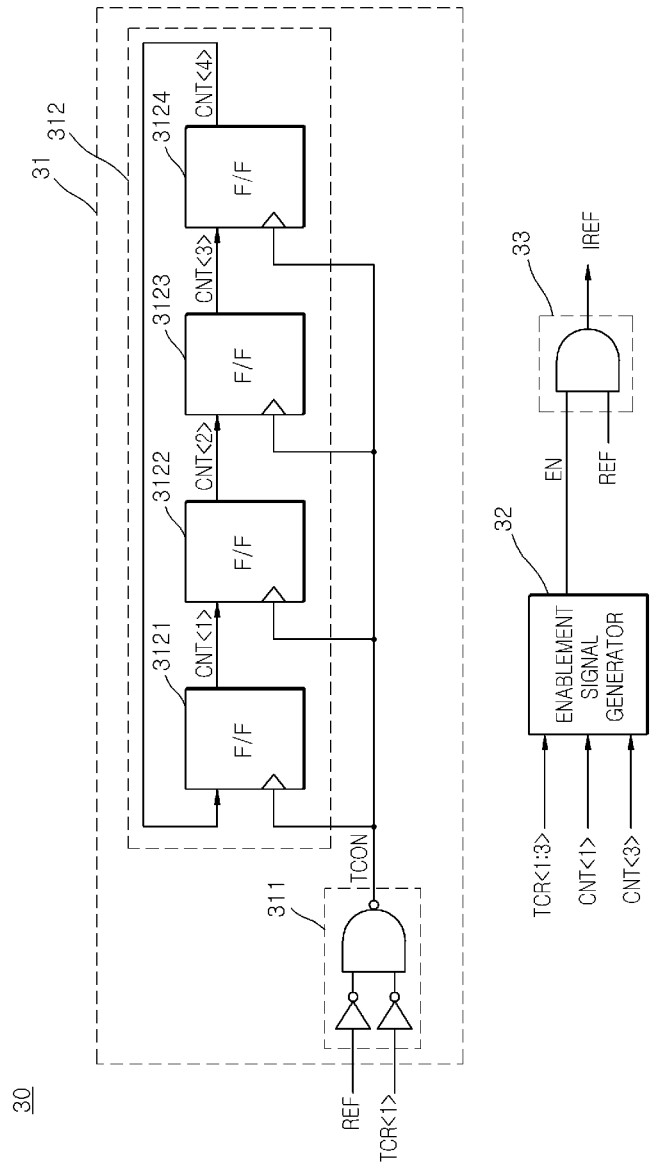
FIG. 4 is a block diagram illustrating an internal refresh signal generator included in the semiconductor device of FIG. 1.

Referring to FIG. 4, the internal refresh signal generator 30 may include a count unit 31, an enablement signal generator 32 and a logic unit 33.

The count unit 31 may include a transmission control signal generator 311 and a counter 312. The transmission control signal generator 311 may generate a transmission control signal TCON which is enabled to have a logic "high" level when the refresh command signal REF or the first control signal TCR<1> is inputted thereto. The counter 312 may generate first to fourth count signals CNT<1:4> which are initialized to have predetermined logic levels in an initialization mode and which are sequentially counted when the transmission control signal TCON is enabled. In the initialization mode, the first to third control signals TCR<1:3> may be set to have a logic "low" level and the fourth control signal TCR<4> may be set to have a logic "high" level.

More specifically, the counter 312 may include a fourth flip-flop 3121 that outputs the fourth count signal CNT<4> as the first count signal CNT<1> when the transmission control signal TCON having a logic "high" level is inputted thereto, a fifth flip-flop 3122 that outputs the first count signal CNT<1> as the second count signal CNT<2> when the transmission control signal TCON having a logic "high" level is inputted thereto, a sixth flip-flop 3123 that outputs the second count signal CNT<2> as the third count signal CNT<3> when the transmission control signal TCON having a logic "high" level is inputted thereto, and a seventh flip-flop 3124 that outputs the third count signal CNT<3> as the fourth count signal CNT<4> when the transmission control signal TCON having a logic "high" level is inputted thereto.

The enablement signal generator 32 may generate an enablement signal EN having a logic "high" level when the first control signal TCR<1> is enabled. Further, the enablement signal generator 32 may generate the enablement signal EN having a logic "high" level when the second control signal TCR<2> is enabled and the first or third count signal CNT<1> or CNT<3> having a logic "high" level is inputted thereto. Moreover, the enablement signal generator 32 may generate the enablement signal EN having a logic "high" level when the third control signal TCR<3> is enabled and the first count signal CNT<1> having a logic "high" level is inputted thereto.

The logic unit 33 may output the refresh command signal REF as the internal refresh signal IREF when the enablement signal EN is enabled to have a logic "high" level.

A configuration of the enablement signal generator 32 will be described more fully hereinafter with reference to FIG. 5.

Figure 5:
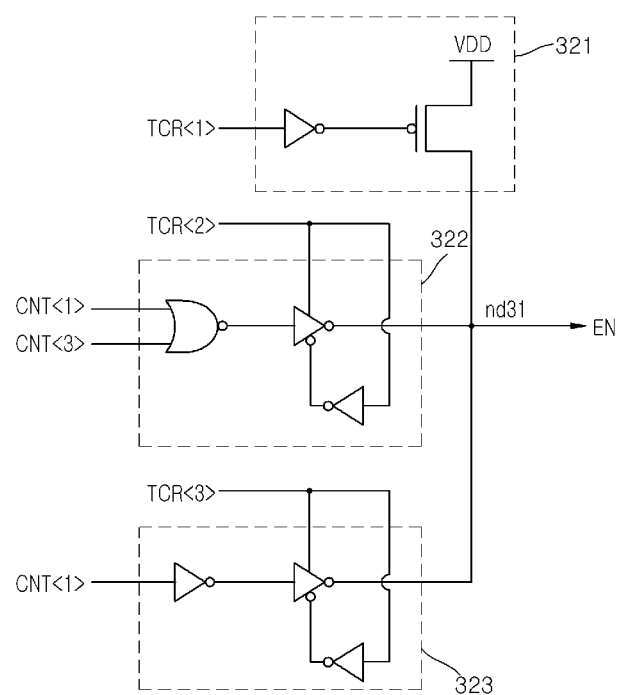
FIG. 5 is a logic circuit diagram illustrating an enablement signal generator included in the internal refresh signal generator of FIG. 4.

Referring to FIG. 5, the enablement signal generator 32 may include a first driver 321, a second driver 322 and a third driver 323.

The first driver 321 may be coupled between a power supply voltage signal VDD terminal and a node ND31. The first driver 321 may drive the node ND31 to generate the enablement signal EN having a logic "high" level outputted through the node ND31 when the first control signal TCR<1> having a logic "high" level is inputted thereto.

The second driver 322 may drive the node ND31 to generate the enablement signal EN having a logic "high" level outputted through the node ND31 when the second control signal TCR<2> having a logic "high" level is inputted thereto and the first or third count signal CNT<1> or CNT<3> having a logic "high" level is inputted thereto.

The third driver 323 may drive the node ND31 to generate the enablement signal EN having a logic "high" level outputted through the node ND31 when the third control signal TCR<3> having a logic "high" level is inputted thereto and the first count signal CNT<1> having a logic "high" level is inputted thereto.

Figure 6:
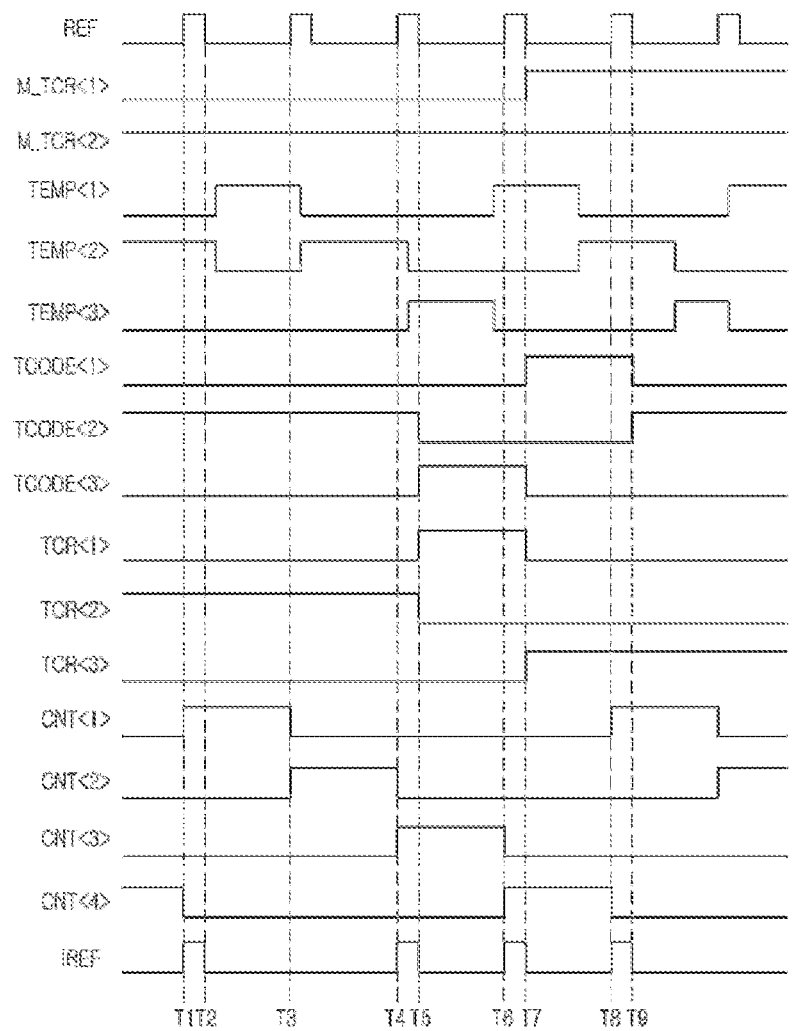
FIG. 6 is a timing diagram illustrating an operation of a semiconductor device according to an embodiment of the present invention.

An operation of the semiconductor device having the aforementioned configuration will be described in detail hereinafter with reference to FIG. 6 in conjunction with an example in which a refresh cycle time is controlled according to a temperature of the internal circuit 40 in the normal mode and an example in which the refresh cycle time is controlled according to a temperature of the internal circuit 40 in the extended mode.

First, an operation for controlling the refresh cycle time according to a temperature of the internal circuit 40 in the normal mode will be described hereinafter.

At a point of time "T1", the operation mode signal generator 21 of the control signal generator 20 may generate the first operation mode signal NORMAL having a logic "high" level in response to the first mode set signal M_TCR<1> having a logic "low" level and the second mode set signal M_TCR<2> having a logic "high" level to put the semiconductor device into the normal mode. The decoder 22 may decode the first temperature code signal TCODE<1> having a logic "low" level, the second temperature code signal TCODE<2> having a logic "high" level and the third temperature code signal TCODE<3> having a logic "low" level in response to the first operation mode signal NORMAL having a logic "high" level to generate the first control signal TCR<1> having a logic "low" level, the second control signal TCR<2> having a logic "high" level and the third control signal TCR<3> having a logic "low" level. The first temperature code signal TCODE<1> having a logic "low" level, the second temperature code signal TCODE<2> having a logic "high" level and the third temperature code signal TCODE<3> having a logic "low" level may mean that the internal circuit 40 has a low temperature.

The count unit 31 of the internal refresh signal generator 30 may receive a first pulse (having a logic "high" level) of the refresh command signal REF to generate the first count signal CNT<1> having a logic "high" level and the second to fourth count signals CNT<2:4> having a logic "low" level. The enablement signal generator 32 may receive the second control signal TCR<2> having a logic "high" level and the first count signal CNT<1> having a logic "high" level to generate the enablement signal EN having a logic "high" level. The logic unit 33 may receive the enablement signal EN having a logic "high" level to output the refresh command signal REF as the internal refresh signal IREF. In such a case, the internal circuit 40 may receive the internal refresh signal IREF having a logic "high" level, which is generated from a first pulse of the refresh command signal REF, to execute a refresh operation.

The buffer 11 of the temperature code generator 10 may inversely buffer the internal refresh signal IREF having a logic "high" level to generate the update signal TUP having a logic "low" level. The transmission signal generator 12 may receive the update signal TUP having a logic "low" level not to output the first to third temperature signals TEMP<1:3> as the first to third transmission signals TS<1:3>. The temperature code output unit 13 does not update the first to third temperature code signals TCODE<1:3> because levels of the first to third transmission signals TS<1:3> are not changed.

At a point of time "T2", the operation mode signal generator 21 of the control signal generator 20 may generate the first operation mode signal NORMAL having a logic "high" level in response to the first mode set signal M_TCR<1> having a logic "low" level and the second mode set signal M_TCR<2> having a logic "high" level to still put the semiconductor device into the normal mode. The decoder 22 may decode the first temperature code signal TCODE<1> having a logic "low" level, the second temperature code signal TCODE<2> having a logic "high" level and the third temperature code signal TCODE<3> having a logic "low" level in response to the first operation mode signal NORMAL having a logic "high" level to generate the first control signal TCR<1> having a logic "low" level, the second control signal TCR<2> having a logic "high" level and the third control signal TCR<3> having a logic "low" level.

The count unit 31 of the internal refresh signal generator 30 may receive the refresh command signal REF having a logic "low" level and the first control signal TCR<1> having a logic "low" level not to count the first to fourth count signals CNT<1:4>. The enablement signal generator 32 may receive the second control signal TCR<2> having a logic "high" level and the first count signal CNT<1> having a logic "high" level to generate the enablement signal EN having a logic "high" level. The logic unit 33 may receive the enablement signal EN having a logic "high" level to output the refresh command signal REF having a logic "low" level as the internal refresh signal IREF.

The buffer 11 of the temperature code generator 10 may inversely buffer the internal refresh signal IREF having a logic "low" level to generate the update signal TUP having a logic "high" level. The transmission signal generator 12 may receive the update signal TUP whose level is changed from a logic "low" level to a logic "high" level to output the first temperature signal TEMP<1> having a logic "low" level, the second temperature signal TEMP<2> having a logic "high" level and the third temperature signal TEMP<3> having a logic "low" level as the first transmission signal TS<1>, the second transmission signal TS<2> and the third transmission signal TS<3> respectively. The temperature code output unit 13 may decode the first to third transmission signals TS<1:3> to update levels of the first to third temperature code signals TCODE<1:3>. As described with reference to the table 1, the first temperature signal TEMP<1> having a logic "low" level, the second temperature signal TEMP<2> having a logic "high" level and the third temperature signal TEMP<3> having a logic "low" level may mean that the internal circuit 40 has a low temperature.

At a point of time "T3", the count unit 31 of the internal refresh signal generator 30 may receive a second pulse (having a logic "high" level) of the refresh command signal REF to generate the second count signal CNT<2> having a logic "high" level and the first, third and fourth count signals CNT<1>, CNT<3> and <4> having a logic "low" level. The enablement signal generator 32 may receive the second control signal TCR<2> having a logic "high" level and the first and third count signals CNT<1> and CNT<3> having a logic "low" level to generate the enablement signal EN having a logic "low" level. The logic unit 33 may receive the enablement signal EN having a logic "low" level to generate the internal refresh signal IREF having a logic "low" level. In such a case, the internal circuit 40 may receive the internal refresh signal IREF having a logic "low" level not to execute a refresh operation.

The buffer 11 of the temperature code generator 10 may inversely buffer the internal refresh signal IREF having a logic "low" level to generate the update signal TUP having a logic "high" level. The transmission signal generator 12 does not output the first to third temperature signals TEMP<1:3> as the first to third transmission signals TS<1:3> because a level of the update signal TUP is not changed. The temperature code output unit 13 does not update the first to third temperature code signals TCODE<1:3> because levels of the first to third transmission signals TS<1:3> are not changed.

At a point of time "T4", the operation mode signal generator 21 of the control signal generator 20 may generate the first operation mode signal NORMAL having a logic "high" level in response to the first mode set signal M_TCR<1> having a logic "low" level and the second mode set signal M_TCR<2> having a logic "high" level to put the semiconductor device into the normal mode. The decoder 22 may decode the first temperature code signal TCODE<1> having a logic "low" level, the second temperature code signal TCODE<2> having a logic "high" level and the third temperature code signal TCODE<3> having a logic "low" level in response to the first operation mode signal NORMAL having a logic "high" level to generate the first control signal TCR<1> having a logic "low" level, the second control signal TCR<2> having a logic "high" level and the third control signal TCR<3> having a logic "low" level.

The count unit 31 of the internal refresh signal generator 30 may receive a third pulse (having a logic "high" level) of the refresh command signal REF to generate the third count signal CNT<3> having a logic "high" level and the first, second and fourth count signals CNT<1>, CNT<2> and CNT<4> having a logic "low" level. The enablement signal generator 32 may receive the second control signal TCR<2> having a logic "high" level and the third count signal CNT<3> having a logic "high" level to generate the enablement signal EN having a logic "high" level. The logic unit 33 may receive the enablement signal EN having a logic "high" level to output the refresh command signal REF as the internal refresh signal IREF. In such a case, the internal circuit 40 may receive the internal refresh signal IREF having a logic "high" level, which is generated from a third pulse of the refresh command signal REF, to execute a refresh operation.

The buffer 11 of the temperature code generator 10 may inversely buffer the internal refresh signal IREF having a logic "high" level to generate the update signal TUP having a logic "low" level. The transmission signal generator 12 may receive the update signal TUP having a logic "low" level not to output the first to third temperature signals TEMP<1:3> as the first to third transmission signals TS<1:3>. The temperature code output unit 13 does not update the first to third temperature code signals TCODE<1:3> because levels of the first to third transmission signals TS<1:3> are not changed.

At a point of time "T5", the count unit 31 of the internal refresh signal generator 30 may receive the refresh command signal REF having a logic "low" level and the first control signal TCR<1> having a logic "low" level not to count the first to fourth count signals CNT<1:4>. The enablement signal generator 32 may receive the second control signal TCR<2> having a logic "high" level and the first count signal CNT<1> having a logic "high" level to generate the enablement signal EN having a logic "high" level. The logic unit 33 may receive the enablement signal EN having a logic "high" level to output the refresh command signal REF having a logic "low" level as the internal refresh signal IREF.

The buffer 11 of the temperature code generator 10 may inversely buffer the internal refresh signal IREF having a logic "low" level to generate the update signal TUP having a logic "high" level. The transmission signal generator 12 may receive the update signal TUP whose level is changed from a logic "low" level to a logic "high" level to output the first temperature signal TEMP<1> having a logic "low" level, the second temperature signal TEMP<2> having a logic "low" level and the third temperature signal TEMP<3> having a logic "high" level as the first transmission signal TS<1>, the second transmission signal TS<2> and the third transmission signal TS<3> respectively. The temperature code output unit 13 may decode the first to third transmission signals TS<1:3> to update levels of the first to third temperature code signals TCODE<1:3>. As described with reference to the table 1, the first temperature signal TEMP<1> having a logic "low" level, the second temperature signal TEMP<2> having a logic "low" level and the third temperature signal TEMP<3> having a logic "high" level may mean that the internal circuit 40 has a high temperature.

The operation mode signal generator 21 of the control signal generator 20 may generate the first operation mode signal NORMAL having a logic "high" level in response to the first mode set signal M_TCR<1> having a logic "low" level and the second mode set signal M_TCR<2> having a logic "high" level to put the semiconductor device into the normal mode. The decoder 22 may decode the first temperature code signal TCODE<1> having a logic "low" level, the second temperature code signal TCODE<2> having a logic "low" level and the third temperature code signal TCODE<3> having a logic "high" level in response to the first operation mode signal NORMAL having a logic "high" level to generate the first control signal TCR<1> having a logic "high" level, the second control signal TCR<2> having a logic "low" level and the third control signal TCR<3> having a logic "low" level.

At a point of time "T6", the operation mode signal generator 21 of the control signal generator 20 may generate the first operation mode signal NORMAL having a logic "high" level in response to the first mode set signal M_TCR<1> having a logic "low" level and the second mode set signal M_TCR<2> having a logic "high" level to put the semiconductor device into the normal mode. The decoder 22 may decode the first temperature code signal TCODE<1> having a logic "low" level, the second temperature code signal TCODE<2> having a logic "low" level and the third temperature code signal TCODE<3> having a logic "high" level in response to the first operation mode signal NORMAL having a logic "high" level to generate the first control signal TCR<1> having a logic "high" level, the second control signal TCR<2> having a logic "low" level and the third control signal TCR<3> having a logic "low" level.

The count unit 31 of the internal refresh signal generator 30 may receive a fourth pulse (having a logic "high" level) of the refresh command signal REF to generate the first to third count signals CNT<1:3> having a logic "low" level and the fourth count signal CNT<4> having a logic "high" level. The enablement signal generator 32 may receive the first control signal TCR<1> having a logic "high" level to generate the enablement signal EN having a logic "high" level. The logic unit 33 may receive the enablement signal EN having a logic "high" level to output the refresh command signal REF as the internal refresh signal IREF. In such a case, the internal circuit 40 may receive the internal refresh signal IREF having a logic "high" level, which is generated from a fourth pulse of the refresh command signal REF, to execute a refresh operation.

The buffer 11 of the temperature code generator 10 may inversely buffer the internal refresh signal IREF having a logic "high" level to generate the update signal TUP having a logic "low" level. The transmission signal generator 12 may receive the update signal TUP having a logic "low" level not to output the first to third temperature signals TEMP<1:3> as the first to third transmission signals TS<1:3>. The temperature code output unit 13 does not update the first to third temperature code signals TCODE<1:3> because levels of the first to third transmission signals TS<1:3> are not changed.

Now, an operation for controlling the refresh cycle time according to a temperature of the internal circuit 40 in the extended mode will be described hereinafter.

At a point of time "T7", the operation mode signal generator 21 of the control signal generator 20 may generate the second operation mode signal EXTEND having a logic "high" level in response to the first mode set signal M_TCR<1> having a logic "high" level and the second mode set signal M_TCR<2> having a logic "high" level to put the semiconductor device into the extended mode. The decoder 22 may decode the first temperature code signal TCODE<1> having a logic "high" level, the second temperature code signal TCODE<2> having a logic "low" level and the third temperature code signal TCODE<3> having a logic "low" level in response to the second operation mode signal EXTEND having a logic "high" level to generate the first control signal TCR<1> having a logic "low" level, the second control signal TCR<2> having a logic "low" level and the third control signal TCR<3> having a logic "high" level.

The count unit 31 of the internal refresh signal generator 30 may receive the refresh command signal REF having a logic "low" level and the first control signal TCR<1> having a logic "low" level not to count the first to fourth count signals CNT<1:4>. The enablement signal generator 32 may receive the third control signal TCR<3> having a logic "high" level and the first count signal CNT<1> having a logic "low" level to generate the enablement signal EN having a logic "low" level. The logic unit 33 may receive the enablement signal EN having a logic "low" level to generate the internal refresh signal IREF having a logic "low" level.

The buffer 11 of the temperature code generator 10 may inversely buffer the internal refresh signal IREF having a logic "low" level to generate the update signal TUP having a logic "high" level. The transmission signal generator 12 may receive the update signal TUP whose level is changed from a logic "low" level to a logic "high" level to output the first temperature signal TEMP<1> having a logic "high" level, the second temperature signal TEMP<2> having a logic "low" level and the third temperature signal TEMP<3> having a logic "low" level as the first transmission signal TS<1>, the second transmission signal TS<2> and the third transmission signal TS<3> respectively. The temperature code output unit 13 may decode the first to third transmission signals TS<1:3> to update levels of the first to third temperature code signals TCODE<1:3>. As described with reference to the table 1, the first temperature signal TEMP<1> having a logic "high" level, the second temperature signal TEMP<2> having a logic "low" level and the third temperature signal TEMP<3> having a logic "low" level may mean that the internal circuit 40 has a low temperature.

At a point of time "T8", the operation mode signal generator 21 of the control signal generator 20 may generate the second operation mode signal EXTEND having a logic "high" level in response to the first mode set signal M_TCR<1> having a logic "high" level and the second mode set signal M_TCR<2> having a logic "high" level to still put the semiconductor device into the extended mode. The decoder 22 may decode the first temperature code signal TCODE<1> having a logic "high" level, the second temperature code signal TCODE<2> having a logic "low" level and the third temperature code signal TCODE<3> having a logic "low" level in response to the second operation mode signal EXTEND having a logic "high" level to generate the first control signal TCR<1> having a logic "low" level, the second control signal TCR<2> having a logic "low" level and the third control signal TCR<3> having a logic "high" level.

The count unit 31 of the internal refresh signal generator 30 may receive a fifth pulse (having a logic "high" level) of the refresh command signal REF to generate the first count signal CNT<1> having a logic "high" level and the second to fourth count signals CNT<2:4> having a logic "low" level. The enablement signal generator 32 may receive the third control signal TCR<3> having a logic "high" level and the first count signal CNT<1> having a logic "high" level to generate the enablement signal EN having a logic "high" level. The logic unit 33 may receive the enablement signal EN having a logic "high" level to output the refresh command signal REF having a logic "high" level as the internal refresh signal IREF. In such a case, the internal circuit 40 may receive the internal refresh signal IREF having a logic "high" level, which is generated from a fifth pulse of the refresh command signal REF, to execute a refresh operation.

The buffer 11 of the temperature code generator 10 may inversely buffer the internal refresh signal IREF having a logic "high" level to generate the update signal TUP having a logic "low" level. The transmission signal generator 12 may receive the update signal TUP having a logic "low" level not to output the first to third temperature signals TEMP<1:3> as the first to third transmission signals TS<1:3>. The temperature code output unit 13 does not update the first to third temperature code signals TCODE<1:3> because levels of the first to third transmission signals TS<1:3> are not changed.

At a point of time "T9", the count unit 31 of the internal refresh signal generator 30 may receive the refresh command signal REF having a logic "low" level and the first control signal TCR<1> having a logic "low" level not to count the first to fourth count signals CNT<1:4>. The enablement signal generator 32 may receive the third control signal TCR<3> having a logic "high" level and the first count signal CNT<1> having a logic "high" level to generate the enablement signal EN having a logic "high" level. The logic unit 33 may receive the enablement signal EN having a logic "high" level to output the refresh command signal REF having a logic "low" level as the internal refresh signal IREF.

The buffer 11 of the temperature code generator 10 may inversely buffer the internal refresh signal IREF having a logic "low" level to generate the update signal TUP having a logic "high" level. The transmission signal generator 12 may receive the update signal TUP whose level is changed from a logic "low" level to a logic "high" level to output the first temperature signal TEMP<1> having a logic "low" level, the second temperature signal TEMP<2> having a logic "high" level and the third temperature signal TEMP<3> having a logic "low" level as the first transmission signal TS<1>, the second transmission signal TS<2> and the third transmission signal TS<3> respectively. The temperature code output unit 13 may decode the first to third transmission signals TS<1:3> to update levels of the first to third temperature code signals TCODE<1:3>. As described with reference to the table 1, the first temperature signal TEMP<1> having a logic "low" level, the second temperature signal TEMP<2> having a logic "high" level and the third temperature signal TEMP<3> having a logic "low" level may mean that the internal circuit 40 has a low temperature.

As described above, a semiconductor device according to the embodiments may output a refresh command signal as an internal refresh signal according to an operation mode and a temperature to control the number of times of a refresh operation. Further, when a level of the internal refresh signal is changed from a logic "high" level to a logic "low" level, temperature signals may be updated into temperature code signals.

Figure 7:
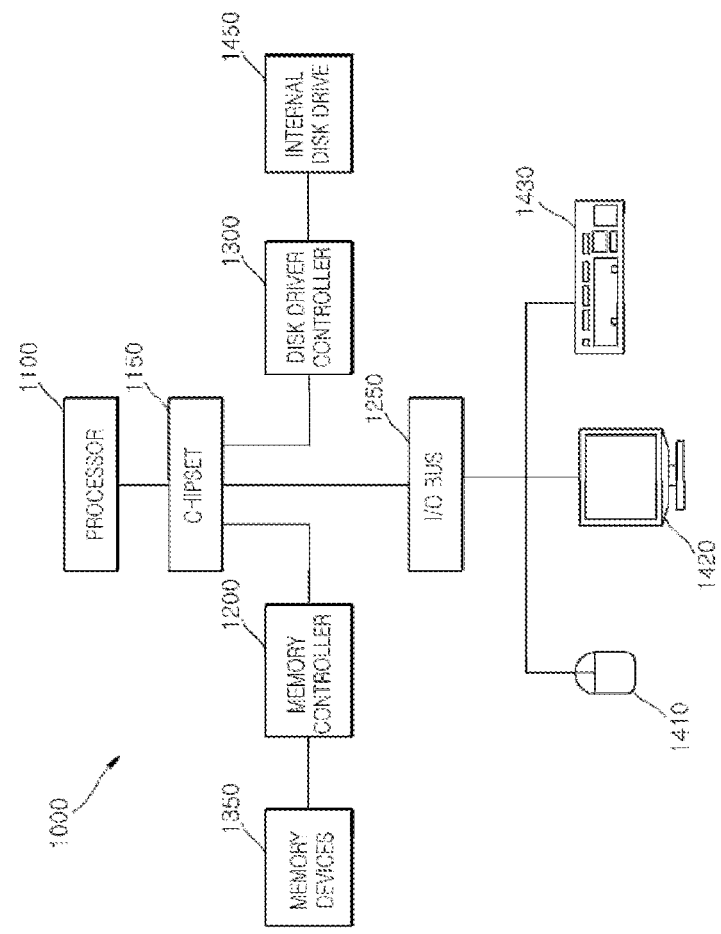
FIG. 7 illustrates a block diagram of a system employing the semiconductor device in accordance with the embodiments associated with FIGS. 1-6, above.

Additionally, the semiconductor device discussed above may be particularly useful in the design of memory devices, processors, and computer systems. For example, referring to FIG. 7, a block diagram of a system employing a memory controller in accordance with embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor device discussed above with reference to FIGS. 1-6, the semiconductor device may include a temperature code generator suitable for decoding temperature signals to generate temperature code signals after a pulse of an internal refresh signal is inputted thereto; a control signal generator suitable for generating first and second control signals, one of which is selectively enabled in response to the temperature code signals and mode set signals received externally from the control signal generator, the temperature code signals being received from the temperature code generator; and an internal refresh signal generator suitable for outputting a refresh command signal as the internal refresh signal to the temperature code generator when the first control signal is enabled and suitable for outputting the refresh command signal as the internal refresh signal to the temperature code generator at a moment that the refresh command signal is inputted thereto by a predetermined number of times when the second control signal is enabled. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing semiconductor device which may output a refresh command signal as an internal refresh signal according to an operation mode and a temperature to control the number of times of a refresh operation. Further, when a level of the internal refresh signal is changed from a logic "high" level to a logic "low" level, temperature signals may be updated into temperature code signals. In alternate embodiments, such as cellular phones or digital cameras, the components may differ from the embodiment shown in FIG. 7.

What is claimed is:

1. A semiconductor device comprising:
   a control signal generator suitable for generating first and second control signals, one of which is selectively enabled in response to temperature code signals and mode set signals, the temperature code signals being obtained from temperature signals; and
   an internal refresh signal generator suitable for outputting a refresh command signal as the internal refresh signal when the first control signal is enabled and suitable for outputting the refresh command signal as the internal refresh signal at a moment that the refresh command signal is inputted thereto by a predetermined number of times when the second control signal is enabled,
   wherein generating first and second control signals and the mode set signals is performed after a pulse of the internal refresh signal is outputted by the internal refresh signal generator.

2. The semiconductor device of claim 1, wherein the first control signal is enabled when an internal circuit has a high temperature in a normal mode which is set by the mode set signals.

3. The semiconductor device of claim 1, wherein the second control signal is enabled when an internal circuit has a low temperature in a normal mode which is set by the mode set signals.

4. The semiconductor device of claim 1, wherein the temperature signals include temperature information on an internal circuit.

5. The semiconductor device of claim 1, wherein the control signal generator includes:
   an operation mode signal generator suitable for generating first and second operation mode signals, one of which is selectively enabled according to the mode set signals; and
   a decoder suitable for decoding the temperature code signals in response to the first and second operation mode signals to generate the first and second control signals.

6. The semiconductor device of claim 1, wherein the internal refresh signal generator includes:
   a count unit suitable for generating first and second count signals which are sequentially counted when the refresh command signal is inputted thereto after an initialization operation;
   an enablement signal generator suitable for generating an enablement signal which is enabled when the first control signal is enabled and which is enabled at an enablement moment of the second count signal when the second control signal is enabled; and
   a logic unit suitable for generating the internal refresh signal when the enablement signal is enabled and the refresh command signal is inputted thereto.

7. The semiconductor device of claim 6, wherein the moment that the refresh command signal is inputted by the predetermined number of times corresponds to a moment that the second control signal is enabled and the first count signal is generated after the initialization operation.

8. The semiconductor device of claim 6, wherein the enablement signal generator includes:
   a first driver suitable for being coupled between a power supply voltage signal terminal and a node and suitable for driving the node in response to the first control signal to generate the enablement signal outputted through the node; and a second driver suitable for driving the node in response to the second control signal at an enablement moment of the second count signal to generate the enablement signal.

9. A semiconductor device comprising:
a temperature code generator suitable for decoding temperature signals to generate temperature code signals after a pulse of an internal refresh signal is inputted thereto;
a control signal generator suitable for generating first to third control signals, one of which is selectively enabled in response to the temperature code signals and mode set signals; and
an internal refresh signal generator suitable for outputting a refresh command signal as the internal refresh signal when the first control signal is enabled, suitable for outputting the refresh command signal as the internal refresh signal at a moment that the refresh command signal is inputted thereto by a first predetermined number of times when the second control signal is enabled, and suitable for outputting the refresh command signal as the internal refresh signal at a moment that the refresh command signal is inputted thereto by a second predetermined number of times when the third control signal is enabled.

10. The semiconductor device of claim 9, wherein the first control signal is enabled when an internal circuit has a high temperature in a normal mode which is set by the mode set signals.

11. The semiconductor device of claim 9, wherein the second control signal is enabled when an internal circuit has a low temperature in a normal mode which is set by the mode set signals or when the internal circuit has a high temperature in an extended mode which is set by the mode set signals.

12. The semiconductor device of claim 9, wherein the third control signal is enabled when an internal circuit has a low temperature in an extended mode which is set by the mode set signals.

13. The semiconductor device of claim 9, wherein the temperature signals include temperature information on an internal circuit.

14. The semiconductor device of claim 9, wherein the temperature code generator includes:
a buffer suitable for buffering the internal refresh signal to generate an update signal;
a transmission signal generator suitable for outputting the temperature signals as transmission signals at a moment that the update signal is enabled; and
a temperature code output unit suitable for decoding the transmission signals to generate the temperature code signals.

15. The semiconductor device of claim 9,
wherein the temperature code signals include a first temperature code signal, a second temperature code signal and a third temperature code signal; and
wherein the control signal generator includes:
an operation mode signal generator suitable for generating first and second operation mode signals, one of which is selectively enabled according to the mode set signals; and
a decoder suitable for decoding the first to third temperature code signals in response to the first and second operation mode signals to generate the first to third control signals.

16. The semiconductor device of claim 9, wherein the internal refresh signal generator includes:
a count unit suitable for generating first to fourth count signals which are sequentially counted when the refresh command signal is inputted thereto after an initialization operation;
an enablement signal generator suitable for generating an enablement signal which is enabled when the first control signal is enabled, which is enabled at an enablement moment of the first or third count signal when the second control signal is enabled, and which is enabled at an enablement moment of the first count signal when the third control signal is enabled; and
a logic unit suitable for generating the internal refresh signal when the enablement signal is enabled and the refresh command signal is inputted thereto.

17. The semiconductor device of claim 16, wherein the moment that the refresh command signal is inputted by the first predetermined number of times corresponds to a moment that the first count signal or the third count signal is generated.

18. The semiconductor device of claim 16, wherein the moment that the refresh command signal is inputted by the second predetermined number of times corresponds to a moment that the second or third control signal is enabled and the first count signal is generated after the initialization operation.

19. The semiconductor device of claim 16, wherein the enablement signal generator includes:
a first driver suitable for being coupled between a power supply voltage signal terminal and a node and suitable for driving the node in response to the first control signal to generate the enablement signal outputted through the node;
a second driver suitable for driving the node in response to the second control signal at an enablement moment of the first or third count signal to generate the enablement signal; and
a third driver suitable for driving the node in response to the third control signal at an enablement moment of the first count signal to generate the enablement signal.

20. A system includes:
a processor;
a memory controller configured to receive a mode set signal from the processor; and
a memory device configured to receive the mode set signal from the memory controller,
wherein the memory device includes:
a temperature code generator suitable for decoding temperature signals to generate temperature code signals after a pulse of an internal refresh signal is inputted thereto;
a control signal generator suitable for generating first and second control signals, one of which is selectively enabled in response to the temperature code signals and mode set signals received externally from the control signal generator, the temperature code signals being received from the temperature code generator; and
an internal refresh signal generator suitable for outputting a refresh command signal as the internal refresh signal to the temperature code generator when the first control signal is enabled and suitable for outputting the refresh command signal as the internal refresh signal to the temperature code generator at a moment that the refresh command signal is inputted thereto by a predetermined number of times when the second control signal is enabled.

* * * * *